(12) United States Patent
Su et al.

(10) Patent No.: US 10,177,245 B2
(45) Date of Patent: Jan. 8, 2019

(54) METHOD OF FABRICATING A SEMICONDUCTOR DEVICE

(71) Applicant: UNITED MICROELECTRONICS CORP., Hsin-Chu (TW)

(72) Inventors: Po-Wen Su, Kaohsiung (TW); Shui-Yen Lu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/660,919

(22) Filed: Jul. 26, 2017

(65) Prior Publication Data

US 2018/0033874 A1     Feb. 1, 2018

Related U.S. Application Data

(62) Division of application No. 15/221,611, filed on Jul. 28, 2016, now Pat. No. 9,755,057.

(51) Int. Cl.
*H01L 29/66* (2006.01)
*H01L 21/02* (2006.01)

(52) U.S. Cl.
CPC .. *H01L 29/66795* (2013.01); *H01L 21/02532* (2013.01); *H01L 21/02667* (2013.01); *H01L 29/66545* (2013.01)

(58) Field of Classification Search
CPC ................................................ H01L 29/66545
See application file for complete search history.

(56) References Cited

U.S. PATENT DOCUMENTS

| | | | |
|---|---|---|---|
| 9,466,722 B2 | 10/2016 | Liu | |
| 2014/0287565 A1 | 9/2014 | Yin | |
| 2014/0315365 A1 | 10/2014 | Chen | |
| 2017/0271513 A1* | 9/2017 | Yamaguchi | ......... H01L 29/7845 |

OTHER PUBLICATIONS

Lysacek, "Structural changes of polycrystalline silicon layers during high temperature annealing", Nov. 2008.

* cited by examiner

*Primary Examiner* — Yu-Hsi D Sun
(74) *Attorney, Agent, or Firm* — Winston Hsu

(57) ABSTRACT

A method of fabricating a semiconductor device is disclosed. A substrate is provided. A dummy gate stack is formed on the substrate. The dummy gate stack includes a gate dielectric layer and an amorphous silicon dummy gate on the gate dielectric layer. The amorphous silicon dummy gate is transformed into a nano-crystalline silicon dummy gate. A spacer is formed on a sidewall of the nano-crystalline silicon dummy gate. A source/drain region is formed in the substrate on either side of the dummy gate stack.

8 Claims, 5 Drawing Sheets

METHOD OF FABRICATING A SEMICONDUCTOR DEVICE

CROSS REFERENCE TO RELATED APPLICATIONS

This application is a division of U.S. application Ser. No. 15/221,611 filed Jul. 28, 2016, which is included in its entirety herein by reference.

BACKGROUND OF THE INVENTION

1. Field of the Invention

The present invention relates to the field of semiconductor processing. More particularly, the present invention relates to a method of fabricating a semiconductor device with a replacement metal gate.

2. Description of the Prior Art

As the size of the integrated circuit devices continues to scale down, the polysilicon gate and the silicon dioxide insulating layer of a metal-oxide-semiconductor field effect transistor (MOSFET) structure have confronted with the physical limits of the materials themselves. To meet the demands of scalability, a high-k metal gate (HK/MG) process is introduced.

In a HK/MG fabrication approach, a dummy gate composed of amorphous silicon is formed over a sacrificial silicon oxide layer in contact with a single-crystal semiconductor region of a substrate. A pair of spacers is disposed on sidewalls of the dummy gate. Later, an interlayer dielectric (ILD) layer is deposited in a blanket manner and a chemical mechanical polishing (CMP) is performed to remove excess ILD layer and expose the dummy gate.

A dummy poly removal (DPR) process is then performed to remove the dummy gate from between the pair of spacers. The sacrificial silicon oxide layer may be cleared from the surface of the substrate as by a dry etch or a wet etch selective to the material of the sidewall spacers. This creates agate trench between the spacers where a high-k dielectric layer is then formed. Thereafter, a replacement metal gate is formed in the gate trench between the spacers contacting the high-k dielectric layer underneath.

Typically, several thermal treatment steps or anneal processes may be performed before the DPR process, and these thermal treatment steps may transform the dummy gate from an amorphous state directly into a polycrystalline state, which arises problems when performing the DPR process. Polysilicon residue defects are observed near the line end of the gate trench because of the difficulty of completely cleaning the polycrystalline Si dummy gate.

SUMMARY OF THE INVENTION

It is one object of the invention to provide an improved method of fabricating a semiconductor device with a replacement metal gate, in order to solve the above-mentioned prior art problems and shortcomings.

According to one embodiment of the invention, a method of fabricating a semiconductor device is disclosed. A substrate is provided. A dummy gate stack is formed on the substrate. The dummy gate stack comprises a gate dielectric layer and an amorphous silicon dummy gate on the gate dielectric layer. The amorphous silicon dummy gate is transformed into a nano-crystalline silicon dummy gate. A spacer is formed on a sidewall of the nano-crystalline silicon dummy gate. A source/drain region is formed in the substrate on either side of the dummy gate stack.

According to one embodiment of the invention, the amorphous silicon dummy gate is transformed into the nano-crystalline silicon dummy gate by performing an annealing process. The annealing process includes heating the substrate and the dummy gate stack at a temperature of about 700~1100° C. for a time period of about 60~120 seconds.

According to another embodiment of the invention, a method of fabricating a semiconductor device is disclosed. A substrate is provided. A gate dielectric layer is formed on the substrate. An amorphous silicon layer is formed on the gate dielectric layer. The amorphous silicon layer is transformed into a nano-crystalline silicon layer. The dummy gate stack comprises the gate dielectric layer and a nano-crystalline silicon dummy gate on the gate dielectric layer. The nano-crystalline silicon layer and the gate dielectric layer are patterned to form a dummy gate stack on the substrate. A spacer is formed on a sidewall of the dummy gate stack. A source/drain region is formed in the substrate on either side of the dummy gate stack.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 10 are schematic, cross-sectional diagrams showing an exemplary method of fabricating a semiconductor device with a replacement metal gate in accordance with one embodiment of the invention, wherein FIG. 8 is a schematic, side-perspective view showing the gate trench after removing the nano-crystalline silicon layer; FIG. 7 is a cross-sectional view taken along line I-I' in FIG. 8; and FIG. 9 is a cross-sectional view taken along line II-II' in FIG. 8.

DETAILED DESCRIPTION

Figure 1:
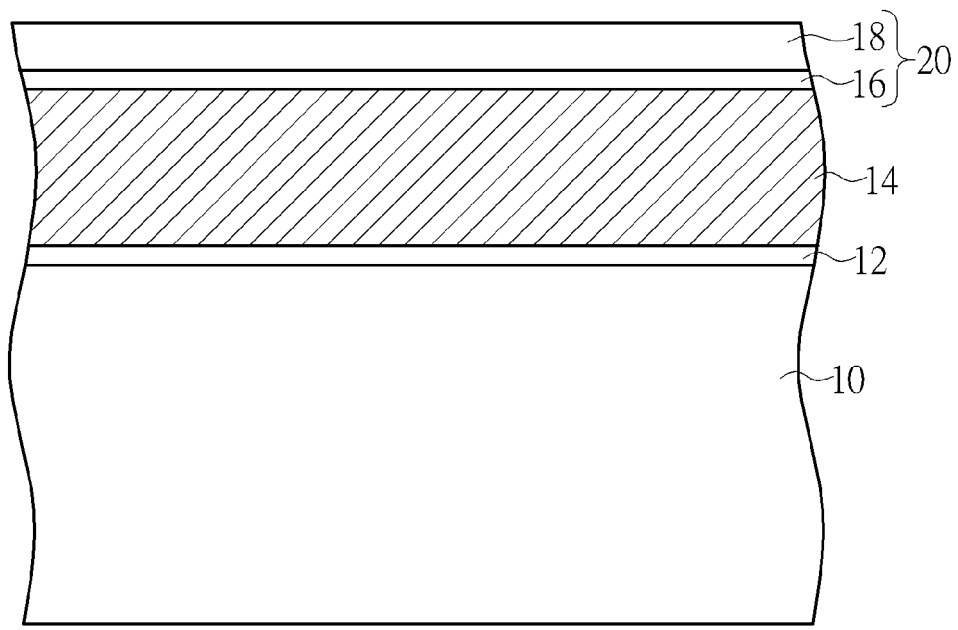

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present disclosure.

The following detailed description is, therefore, not to be taken in a limiting sense, and the scope of the present invention is defined only by the appended claims, along with the full scope of equivalents to which such claims are entitled. One or more implementations of the present invention will now be described with reference to the attached drawings, wherein like reference numerals are used to refer to like elements throughout, and wherein the illustrated structures are not necessarily drawn to scale.

The terms substrate used herein include any structure having an exposed surface onto which a layer is deposited according to the present invention, for example, to form the integrated circuit (IC) structure. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art.

The term "horizontal" as used herein is defined as a plane parallel to the conventional major plane or surface of a semiconductor substrate, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

Please refer to FIG. 1 to FIG. 10. FIG. 1 to FIG. 10 are schematic, cross-sectional diagrams showing an exemplary method of fabricating a semiconductor device with a replacement metal gate in accordance with one embodiment of the invention. According to one embodiment of the invention, the semiconductor device may comprise a fin field-effect-transistor (Fin-FET) device, but is not limited thereto.

As shown in FIG. 1, a substrate 10 is provided. According to one embodiment of the invention, the substrate 10 may comprise a silicon substrate, a SiGe substrate, or a silicon-on-insulator (SOI) substrate or a suitable semiconductor substrate, but is not limited thereto. The substrate 10 may comprise at least one fin structure. According to one embodiment of the invention, a gate dielectric layer 12 such as a silicon oxide layer is formed on the substrate 10. An amorphous silicon layer 14 is deposited on the gate dielectric layer 12. According to one embodiment of the invention, a hard mask 20 including, but not limited to, a silicon nitride layer 16 and a silicon oxide layer 18 may be formed on the amorphous silicon layer 14.

Figure 2:
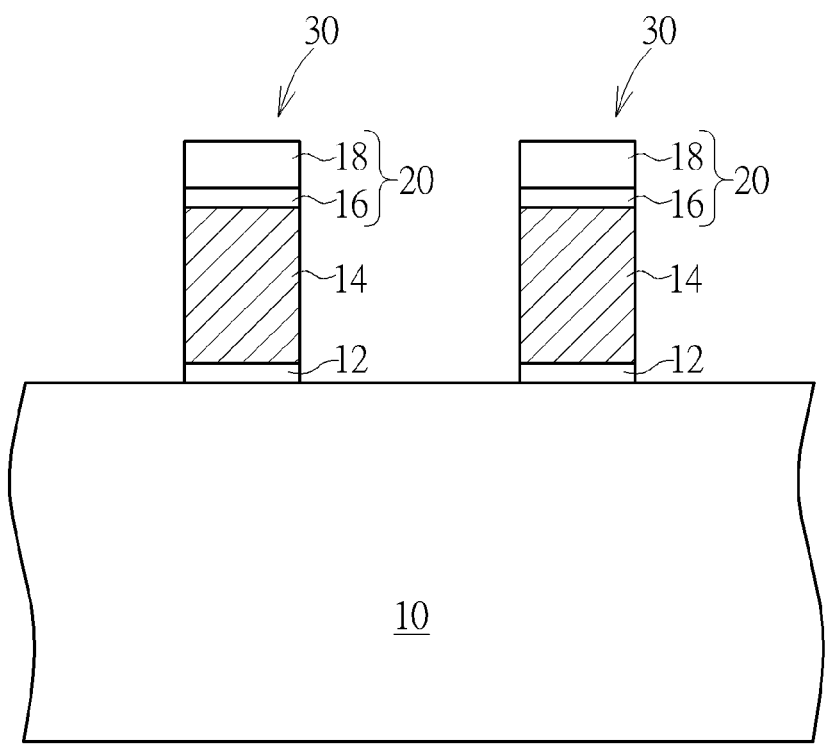

As shown in FIG. 2, a lithographic process and an etching process are performed to pattern the hard mask 20, the amorphous silicon layer 14, and the gate dielectric layer 12 into dummy gate stacks 30. Each of the dummy gate stacks 30 comprises the gate dielectric layer 12a and the amorphous silicon layer 14 on the gate dielectric layer. The amorphous silicon layer 14 acts as an amorphous silicon dummy gate. For example, the lithographic process may involve the use of a patterned photoresist layer (not shown) disposed on the hard mask 20. For example, the etching process may be an anisotropic dry etching process.

Figure 3:
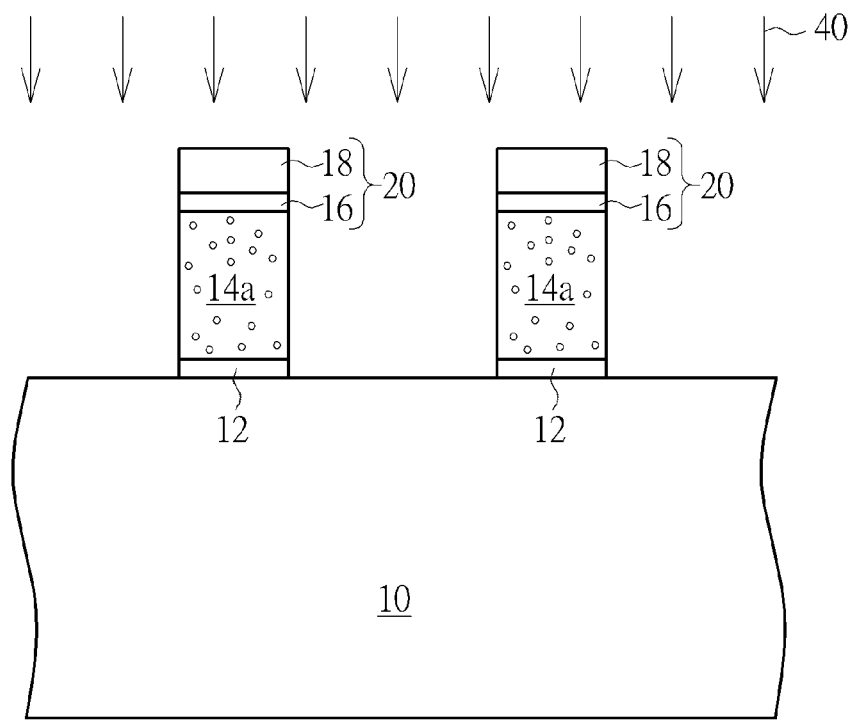

As shown in FIG. 3, an annealing process 40 is performed to transforming the amorphous silicon layer 14 into a nano-crystalline silicon layer 14a. The nano-crystalline silicon layer 14a acts as a nano-crystalline silicon dummy gate and will be replaced with a metal gate later. According to one embodiment of the invention, the annealing process may comprise heating the substrate 10 and the dummy gate stack 30 at a temperature of about 700~1100° C., e.g. 950° C., for a time period of about 60~120 seconds. Under these conditions, the nucleation rate is fast and nano-crystalline silicon with an average crystal grain size of equal to or smaller than 20 nm is formed.

According to another embodiment of the invention, the annealing process 40 may be carried out after the deposition of the amorphous silicon layer 14 and before the formation of the dummy gate stacks 30. In this case, the amorphous silicon layer 14 is transformed into a nano-crystalline silicon layer 14a. Later, the nano-crystalline silicon layer 14a and the gate dielectric layer 12 are patterned into dummy gate stack 30 on the substrate 10.

Figure 4:
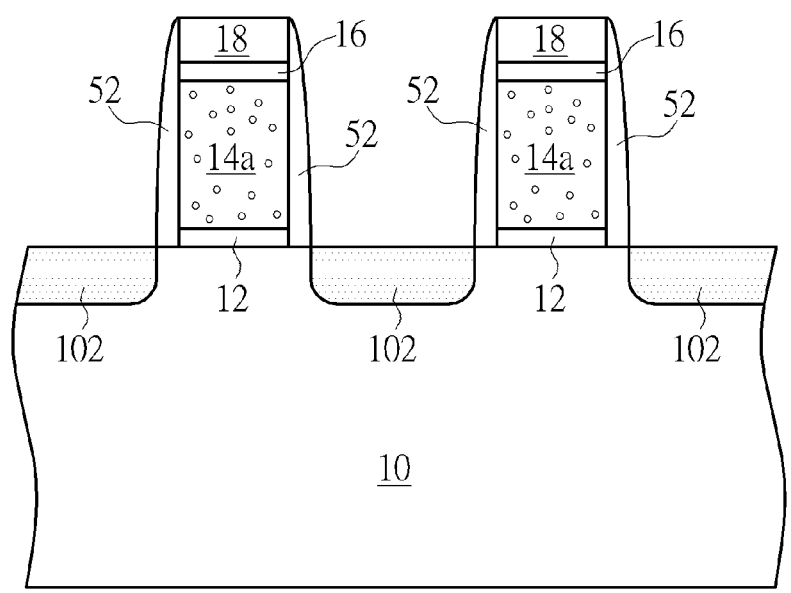

As shown in FIG. 4, after the annealing process, spacers 52 are formed on sidewalls of the dummy gate stacks 30. The spacers 52 may be subjected to an anneal process at a temperature of, for example, 600~750° C., for 1~2 hours. According to one embodiment of the invention, the spacers 52 may comprise silicon nitride, silicon oxide, silicon oxynitride, or a combination thereof.

Figure 5:
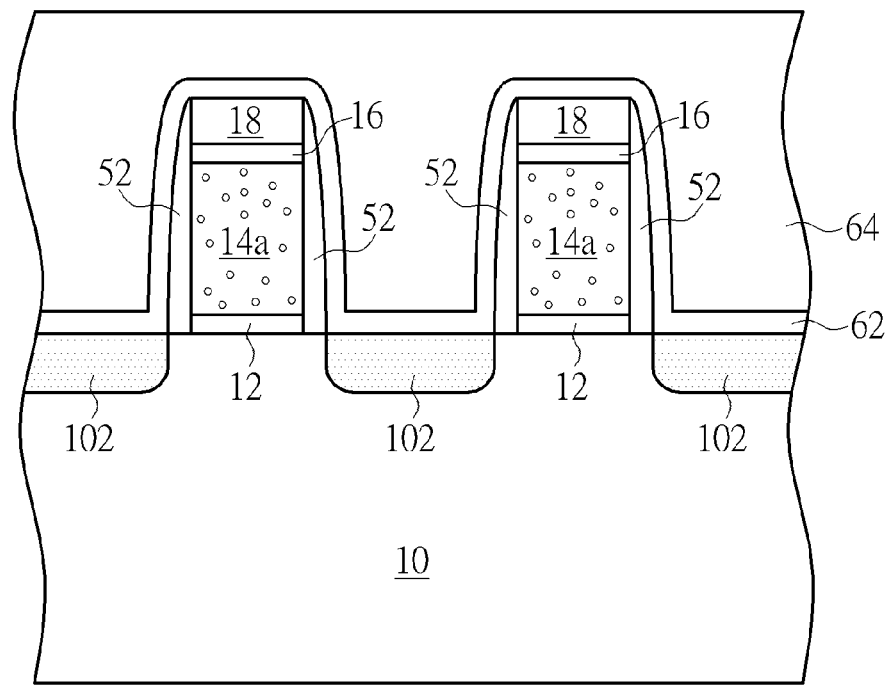

As shown in FIG. 5, an ion implantation process may be performed to form source/drain regions 102 in the substrate 10 on both sides of each dummy gate stack 30. The source/drain regions 102 may have desired conductivity type depending upon the types of the MOS devices. Optionally, a second spacer (not shown) may be formed on the spacers 52. An epitaxial layer (not shown) such as a SiP layer or a SiGe layer may be formed in the source/drain region 102 by using methods known in the art.

Subsequently, a contact etch stop layer (CESL) 62 is deposited on the substrate 10 in a blanket manner. The CESL 62 conformally covers the dummy gate stacks 30, the source/drain regions 102, and the spacers 52. For example, the CESL 62 may comprise silicon nitride, but is not limited thereto. An interlayer dielectric (ILD) layer 64 is deposited on the CESL 62. For example, the ILD layer 64 may comprise Flowable CVD oxide (FCVD oxide), but is not limited thereto.

Figure 6:
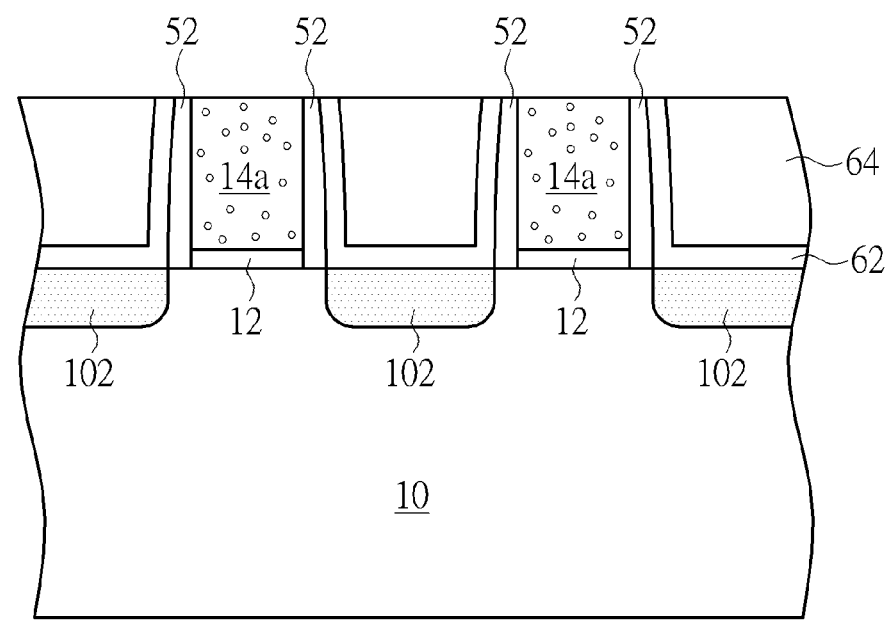

As shown in FIG. 6, after depositing the ILD layer 64 on the CESL 62, a polishing process such as a chemical mechanical polishing (CMP) process may be performed to remove a portion of the ILD layer 64, a portion of the CESL 62, and the hard mask 20, thereby exposing the nano-crystalline silicon layer 14a of each dummy gate stacks 30.

Figure 7:
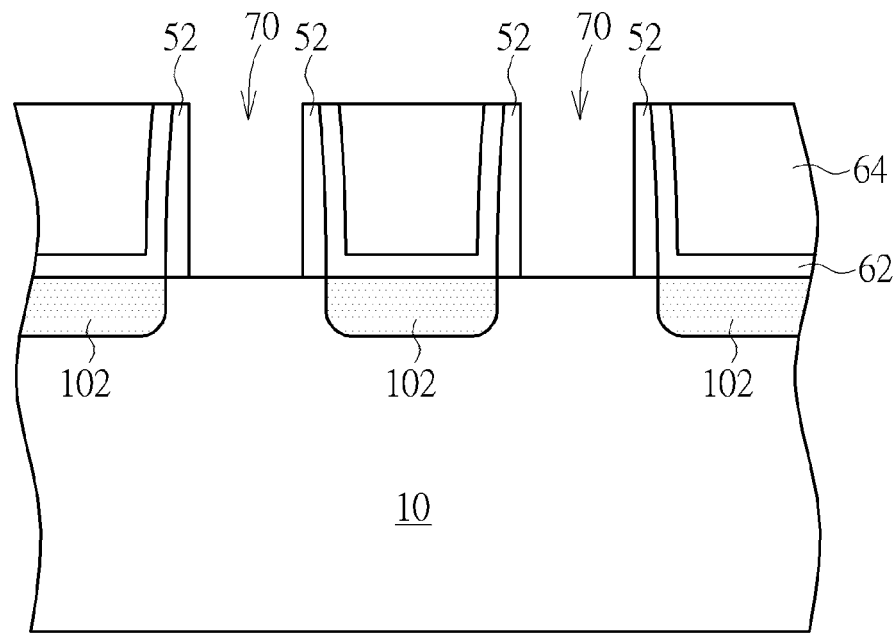
Figure 8:
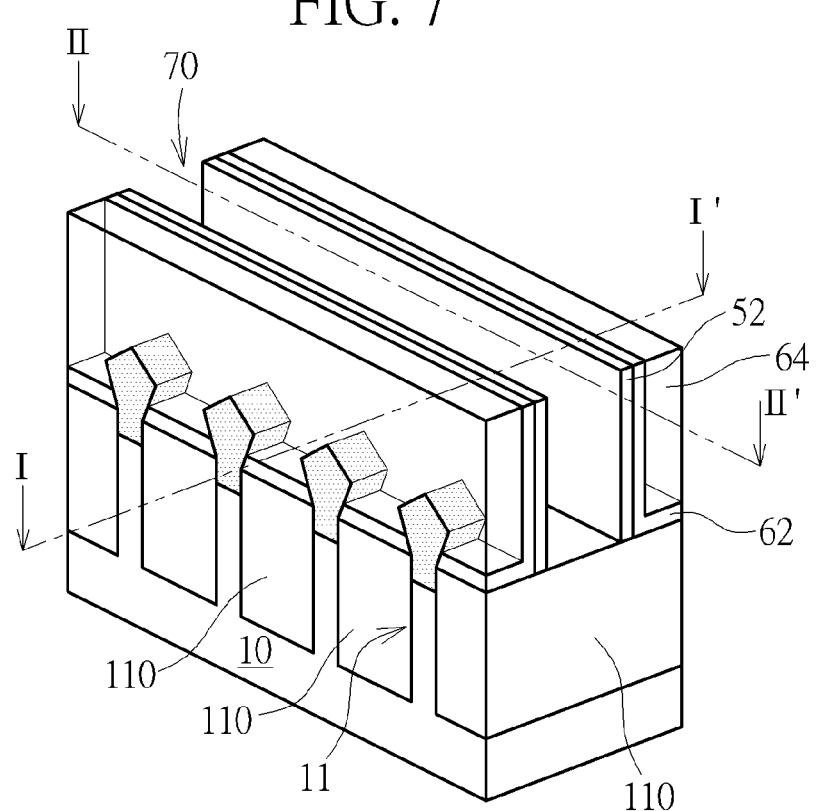
Figure 9:
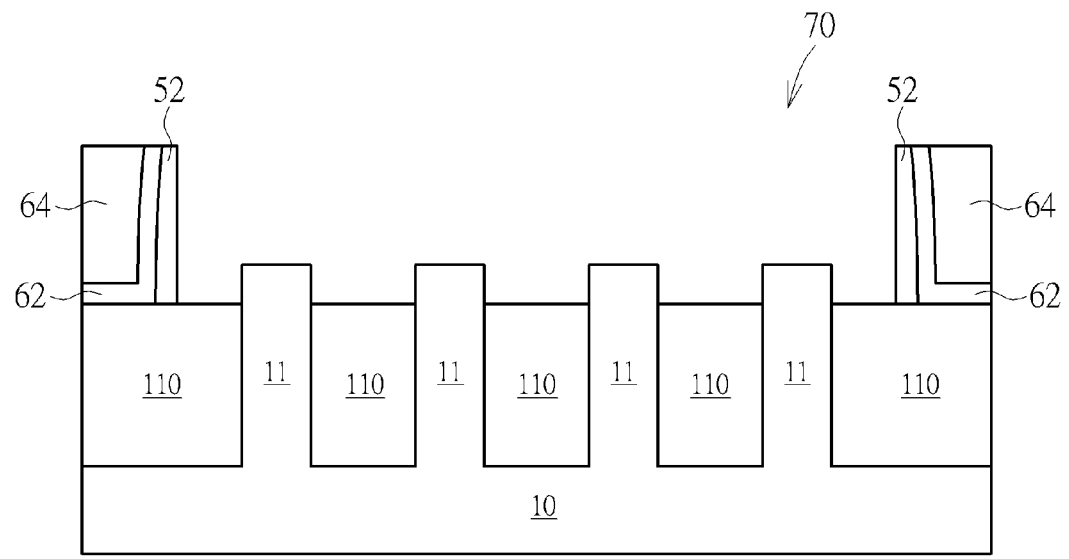

As shown in FIG. 7, the nano-crystalline silicon layer 14a of each dummy gate stack 30 is completely removed from between the pair of spacers 52, thereby forming a gate trench 70 in place of each dummy gate stack 30. The gate dielectric layer 12 may also be removed. According to one embodiment of the invention, the nano-crystalline silicon layer 14a may be removed by using tetramethylammonium hydroxide (TMAH) or ammonium hydroxide. Please also refer to FIG. 8 and FIG. 9. A schematic, side-perspective view of the intermediate semiconductor device showing the gate trench after removing the nano-crystalline silicon layer is depicted in FIG. 8, wherein FIG. 7 is a cross-sectional view taken along line I-I' in FIG. 8 and FIG. 9 is a cross-sectional view taken along line II-II' in FIG. 8. In FIG. 8, the fin structures 11 are shown and the fin structures 11 are surrounded by isolation region 110.

Figure 10:
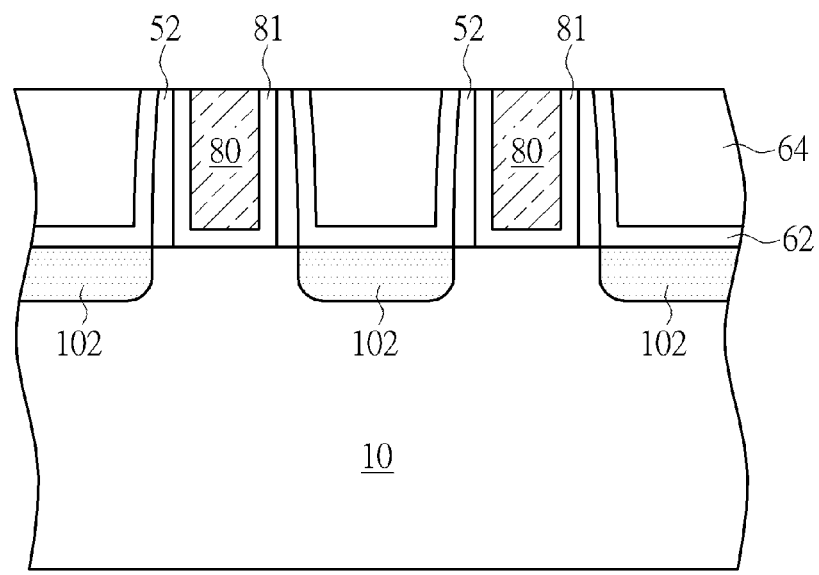

As shown in FIG. 10, the gate trench 70 is filled with a metal gate 80. The metal gate 80 may comprise work function metals, barrier metals, and low-resistance metals, but is not limited thereto. For example, the metal gate 80 may comprise tungsten (W), tantalum nitride (TaN) or titanium nitride (TiN), titanium carbide (TiC), tantalum carbide (TaC), tungsten carbide (WC), titanium aluminide (TiAl), aluminum titanium nitride (TiAlN), aluminum, tungsten, titanium aluminum alloy (TiAl), or cobalt tungsten phosphide (CoWP).

A high-k dielectric layer 81 may be formed between the metal gate 80 and the substrate 10. The high-k dielectric layer 81 may comprise hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xZr_{1-x}O_3$, PZT), or barium strontium titanate ($Ba_xSr_{1-x}Ti_3$, BST).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a semiconductor device, comprising:
    providing a substrate;
    forming a gate dielectric layer on the substrate;
    forming an amorphous silicon layer on the gate dielectric layer;
    transforming the amorphous silicon layer into a nano-crystalline silicon layer, wherein the nano-crystalline silicon layer has an average crystal grain size of equal to or smaller than 20 nm;
    patterning the nano-crystalline silicon layer and the gate dielectric layer to form a dummy gate stack on the substrate, the dummy gate stack comprising the gate dielectric layer and a nano-crystalline silicon dummy gate made from the nano-crystalline silicon layer, the nano-crystalline silicon dummy gate is disposed on the gate dielectric layer;
    forming a spacer on a sidewall of the dummy gate stack; and
    forming a source/drain region in the substrate on either side of the dummy gate stack.

2. The method according to claim 1, wherein the amorphous silicon layer is transformed into the nano-crystalline silicon layer by performing an annealing process.

3. The method according to claim 2, wherein the annealing process comprising heating the substrate and the dummy gate stack at a temperature of about 700~1100° C. for a time period of about 60~120 seconds.

4. The method according to claim 1, wherein after forming the source/drain region in the substrate on either side of the dummy gate stack, the method further comprises:
    depositing a contact etch stop layer (CESL) on the substrate; and
    depositing an interlayer dielectric (ILD) layer on the CESL.

5. The method according to claim 4, wherein after depositing the ILD layer on the CESL, the method further comprises:
    removing a portion of the ILD layer and a portion of the CESL to expose the nano-crystalline silicon dummy gate; and
    removing the nano-crystalline silicon dummy gate to form a gate trench in place.

6. The method according to claim 5, wherein after removing the nano-crystalline silicon dummy gate, the method further comprises:
    forming a metal gate in the gate trench.

7. The method according to claim 5, wherein the nano-crystalline silicon dummy gate is removed by using tetramethylammonium hydroxide (TMAH) or ammonium hydroxide.

8. The method according to claim 1 further comprising:
    further removing the gate dielectric layer and the nano-crystalline silicon dummy gate to form a gate trench, wherein the nano-crystalline silicon dummy gate is completely removed in the gate trench.

* * * * *